(12) United States Patent
Pitney et al.

(10) Patent No.: US 8,440,541 B2
(45) Date of Patent: May 14, 2013

(54) METHODS FOR REDUCING THE WIDTH OF THE UNBONDED REGION IN SOI STRUCTURES

(75) Inventors: John A. Pitney, St. Peters, MO (US); Ichiro Yoshimura, Utsunomiya (JP); Lu Fei, St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 13/021,467

(22) Filed: Feb. 4, 2011

(65) Prior Publication Data

US 2011/0207246 A1 Aug. 25, 2011

Related U.S. Application Data

(60) Provisional application No. 61/308,185, filed on Feb. 25, 2010.

(51) Int. Cl.
*H01L 21/00* (2006.01)
*H01L 21/78* (2006.01)

(52) U.S. Cl.
USPC ........................................................ 438/455

(58) Field of Classification Search .................. 438/455, 438/457, 458; 257/E21.001, E21.002, E21.599
See application file for complete search history.

(56) References Cited

U.S. PATENT DOCUMENTS

| | | | |
|---|---|---|---|
| 5,189,500 A | 2/1993 | Kusunoki | |
| 5,436,175 A | 7/1995 | Nakato et al. | |
| 5,571,373 A | 11/1996 | Krishna et al. | |
| 5,780,311 A | 7/1998 | Beasom et al. | |
| 6,265,314 B1 * | 7/2001 | Black et al. | 438/690 |
| 6,321,134 B1 | 11/2001 | Henley et al. | |
| 6,627,519 B2 | 9/2003 | Kwon et al. | |
| 6,790,747 B2 | 9/2004 | Henley et al. | |
| 6,824,622 B2 * | 11/2004 | Liu et al. | 134/30 |
| 7,161,224 B2 | 1/2007 | Tolchinsky et al. | |
| 7,391,047 B2 | 6/2008 | Henley et al. | |
| 7,452,584 B2 | 11/2008 | Maleville | |
| 7,476,940 B2 | 1/2009 | Couillard et al. | |
| 7,790,569 B2 | 9/2010 | Knechtel et al. | |
| 2002/0187595 A1 | 12/2002 | Walitzki et al. | |

(Continued)

FOREIGN PATENT DOCUMENTS

| EP | 1170801 A1 | 9/2002 |
|---|---|---|
| EP | 1566830 A1 | 8/2005 |

OTHER PUBLICATIONS

International Search Report and Written Opinion mailed on May 26, 2011 in International Application No. PCT/US2011/023937 filed on Feb. 7, 2011.
Co-Owned U.S. Appl. No. 13/021,443, filed Feb. 4, 2011.

(Continued)

*Primary Examiner* — Jarrett Stark
*Assistant Examiner* — Michele Fan
(74) *Attorney, Agent, or Firm* — Armstrong Teasdale LLP

(57) ABSTRACT

The disclosure relates to preparation of silicon on insulator structures with reduced unbonded regions and to methods for producing such wafers by minimizing the roll-off amount (ROA) of the handle and donor wafers. Methods for polishing wafers are also provided.

29 Claims, 13 Drawing Sheets

U.S. PATENT DOCUMENTS

| | | | |
|---|---|---|---|
| 2003/0022495 | A1 | 1/2003 | Netsu et al. |
| 2003/0190810 | A1 | 10/2003 | Cooper |
| 2004/0072437 | A1 | 4/2004 | Iizuka et al. |
| 2005/0014455 | A1 | 1/2005 | Masumura et al. |
| 2006/0024915 | A1 | 2/2006 | Kobayashi |
| 2006/0030123 | A1 | 2/2006 | Nevin et al. |
| 2007/0042566 | A1 | 2/2007 | Seacrist et al. |
| 2007/0231931 | A1 | 10/2007 | Ecarnot et al. |
| 2007/0267142 | A1* | 11/2007 | Murphy et al. .......... 156/345.24 |
| 2008/0153251 | A1* | 6/2008 | Kostrzewa et al. ............ 438/406 |
| 2008/0262751 | A1* | 10/2008 | Fettig et al. ..................... 702/36 |

OTHER PUBLICATIONS

Masahiro Kimura, et al., A New Method for the Precise Measurement of Wafer Roll off of silicon Polished Wafer, Japanese Journal of Applied Physics, vol. 38, 1999, pp. 38-39.

SEMI M69-0307 (Preliminary) Practice for Determining Wafer near-Edge Geometry Using Roll-Off Amount, ROA, 2007, pp. 1-9.

Office Action dated Feb. 29, 2012 in Co-Owned U.S. Appl. No. 13/021,443.

Notice of Allowance dated Oct. 30, 2012 in Co-Owned U.S. Appl. No. 13/021,443.

* cited by examiner

METHODS FOR REDUCING THE WIDTH OF THE UNBONDED REGION IN SOI STRUCTURES

CROSS-REFERENCE TO RELATED APPLICATION

This application claims the benefit of U.S. Provisional Application No. 61/308,185, filed Feb. 25, 2010, which is incorporated herein by reference in its entirety.

BACKGROUND

The field of this disclosure relates to preparation of silicon on insulator structures with reduced unbonded regions and, particularly, methods for producing such structures by minimizing the roll-off amount ("ROA") of the handle and donor wafers.

Silicon on insulator structures ("SOI structures" which may also be referred to herein as "SOI wafers" or "SOI substrates") generally include a handle wafer, a silicon layer (also characterized as a "device layer"), and a dielectric layer (such as an oxide layer) between the handle wafer and the silicon layer. Transistors built within the top silicon layer of SOI structures switch signals quickly compared to transistors built on bulk silicon wafers, run at lower voltages and are much less vulnerable to signal noise from background cosmic ray particles. Each transistor is isolated from its neighbor by a complete layer of silicon dioxide. These transistors are generally immune to "latch-up" problems and can be spaced closer together than transistors built on bulk silicon wafers. Building circuits on SOI structures increases productivity by allowing for more compact circuit designs, yielding more chips per wafer.

SOI structures may be prepared from silicon wafers sliced from single crystal silicon ingots grown in accordance with the Czochralski method. In one method for preparing a SOI structure, a dielectric layer is deposited on a polished front surface of a donor wafer. Ions are implanted at a specified depth beneath the front surface of the donor wafer to form a cleave plane, which is generally perpendicular to the axis, in the donor wafer at the specified depth at which they were implanted. The front surface of the donor wafer is then bonded to a handle wafer and the two wafers are pressed to form a bonded wafer. A portion of the donor wafer is then cleaved along the cleave plane to remove a portion of the donor wafer leaving behind a thin silicon layer (i.e., the device layer) to form the SOI structure.

A lack of bonding or weak bonding between the dielectric layer and the handle wafer at the periphery of the bonded structure causes the dielectric layer and/or the silicon layer at the periphery to be removed during subsequent cleaving. This results in a SOI structure that has a silicon layer (and typically also a dielectric layer) with a smaller radius than the handle wafer. The peripheral region of the structure that does not include the silicon layer is not available for device fabrication and is also a potential source of particle contamination. This unusable peripheral region may have a width of at least 1.5 mm or even 2 mm and may include at least about 2.5% of the SOI structure's surface area.

There is a continuing need for processes for manufacturing SOI wafers that allow the silicon layer of the structure to extend further to the edge of the handle wafer and that minimize the sources of particle contamination.

SUMMARY

It has been found that minimizing the roll-off amount ("ROA") of the handle wafer and/or the donor wafer of the SOI structure allows for more bonding and stronger bonding at the bonded wafer periphery which allows the silicon layer to extend closer to the handle wafer edge upon cleaving. It has further been found that handle and donor wafers with less roll-off and that lack brightfield defects may be prepared by performing a cleaning operation between rough polishing and finish polishing steps.

One aspect of the present disclosure is directed to a process for producing a silicon on insulator structure. The structure includes a handle wafer, a silicon layer, and a dielectric layer between the handle wafer and the silicon layer. The structure has a central axis, a front surface and a back surface that are generally perpendicular to the central axis. A circumferential edge joins the front and back surfaces and a radius extends from the central axis to the circumferential edge of the structure. A dielectric layer is formed on the front surface of at least one of a donor wafer and a handle wafer. The dielectric layer is bonded to at least one of the donor wafer and the handle wafer to form a bonded wafer. At least one of the donor wafer and the handle wafer has a thickness Roll-Off Amount (ROA) of less than about −700 nm. The bonded wafer is separated along a separation plane within the donor wafer such that the silicon layer remains bonded to the dielectric layer to form the silicon on insulator structure.

A further aspect of the present disclosure is directed to a process for polishing a wafer. A first polishing step is performed that includes polishing the wafer with a polyurethane foam pad. A cleaning step that includes cleaning the front surface of the handle wafer is performed after the first polishing step. A second polishing step is performed after the cleaning step. The second polishing step includes polishing the wafer with a polyurethane foam pad.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION

Figure 1:
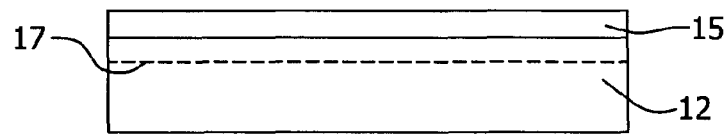
FIG. 1 is cross-section view of a donor wafer with a dielectric layer disposed thereon.

Multi-layered structures and, in particular, silicon on insulator structures and methods for producing silicon on insulator structures are generally known by those skilled in the art (see, for example, U.S. Pat. Nos. 5,189,500; 5,436,175 and 6,790,747, each of which is incorporated herein by reference for all relevant and consistent purposes). In an exemplary process for making a multi-layered structure, two separate structures are prepared, bonded together along a bond interface, and then delaminated (i.e., cleaved) along a separation plane that is different from the bond interface and which has been formed via an implantation technique. One structure is typically referred to as the "handle" wafer (or structure) and the other is typically referred to as the "donor" wafer (or structure).

A dielectric layer may be deposited on the surface of the donor wafer, the handle wafer or both, prior to bonding the donor and handle together. In this regard, the SOI structures and methods for preparing the SOI structures are described herein as having a dielectric layer deposited or grown on the donor wafer and as having the surface of the handle wafer bonded to the surface of the dielectric layer. However, it should be understood that the dielectric layer may be grown or deposited on the handle wafer alternatively or in addition to growing or depositing the dielectric layer on the donor wafer and that these structures may be bonded in any of the various arrangements without limitation. Reference herein to the dielectric layer being disposed on the handle wafer alone should not be considered in a limiting sense.

Typically, at least the donor wafer and more typically both the donor wafer and the handle wafer are composed of single crystal silicon wafers, however it should be noted that other starting structures may be used such as multi-layered and/or heterolayered structures without departing from the present disclosure. In accordance with the present disclosure, the handle wafer and/or the donor wafer are characterized by having an edge roll-off amount ("ROA") that is below conventional donor and handle wafers that are used to produce multi-layered structures such as SOI structures.

The handle wafer may be obtained from any material common in the art for preparing multi-layered structures, such as silicon, germanium, gallium arsenide, silicon germanium, gallium nitride, aluminum nitride, phosphorous, quartz, sapphire and combinations thereof. Similarly, the donor wafer may contain silicon, germanium, gallium arsenide, silicon germanium, gallium nitride, aluminum nitride, phosphorous, quartz, sapphire and combinations thereof. Typically however, the handle wafers and donor wafers used according to the methods of the present disclosure are single crystal silicon wafers and generally are single crystal silicon wafers which have been sliced from a single crystal ingot grown in accordance with conventional Czochralski crystal growing methods. As such, the following discussion frequently refers to a specific type of multi-layered structure, i.e., SOI structures, for illustrative purposes. In this regard, it should be noted that the handle wafer and/or the donor wafer (and even a bulk silicon wafer subjected to the polishing and cleaning steps described below) used in accordance with the present disclosure may be any diameter suitable for use by those of skill in the art including, for example, 200 mm, 300 mm, greater than 300 mm or even 450 mm diameter wafers.

Referring to FIG. 1, a dielectric layer 15 (e.g., a silicon oxide and/or silicon nitride layer) is deposited on a polished front surface of a donor wafer 12. The dielectric layer 15 may be applied according to any known technique in the art, such as thermal oxidation, wet oxidation, thermal nitridation or a combination of these techniques. Generally speaking, the dielectric layer 15 is grown to a substantially uniform thickness sufficient to provide the desired insulating properties in the final structure. Typically, however, the dielectric layer has a thickness of at least about 1 nm and less than about 500 nm, less than about 300 nm, less than about 200 nm, less than about 150 nm, less than about 100 nm or even less than about 50 nm. The dielectric layer 15 may be any electrically insulating material suitable for use in a SOI structure, such as a material comprising $SiO_2$, $Si_3N_4$, aluminum oxide, or magnesium oxide. In one embodiment, the dielectric layer 15 is $SiO_2$ (i.e., the dielectric layer consists essentially of $SiO_2$). However, it is to be noted that in some instances, it may alternatively be preferable to use a material for the dielectric layer which has a melting point which is higher than the melting point of pure $SiO_2$ (i.e., higher than about 1700° C.). Examples of such materials are silicon nitride ($Si_3N_4$), aluminum oxide, and magnesium oxide.

In this regard it should be understood that, while the SOI structures are described herein as having a dielectric layer, in some embodiments the dielectric layer is eliminated and the handle wafer and donor wafer are "direct bonded." Reference herein to such dielectric layers should not be considered in a limiting sense. Any one of a number of techniques known to those of skill in the art may be used to produce such direct bonded structures.

Ions (e.g., hydrogen atoms, helium atoms or a combination of hydrogen and helium atoms) are implanted at a substantially uniform specified depth beneath the front surface of the donor wafer to define a cleave plane 17. It should be noted, that when combinations of ions are implanted, they may be implanted concurrently or sequentially. Ion implantation may be achieved using means known in the art. For example, this implantation may be achieved in a manner similar to the process disclosed in U.S. Pat. No. 6,790,747. Implantation parameters may include, for example, implantation of ions to a total dose of about $1 \times 10^{15}$ to about $5 \times 10^{16}$ ions/cm$^2$ at a total energy of, for example, about 20 to about 125 keV (e.g., $H_2^+$ may be implanted at an energy of 20 keV and a dose of $2.4 \times 10^{16}$ ions/cm$^2$). When a combination of ions is used, the dose may be adjusted between the combination of ions accordingly (e.g., $He^+$ may be implanted at an energy of 36 keV and a dose of $1 \times 10^{16}$ ions/cm$^2$ followed by $H_2^+$ implanted at an energy of 48 keV and a dose of $5 \times 10^{15}$ ions/cm$^2$).

When implantation is performed prior to deposition of the dielectric layer, the subsequent growth or deposition of the dielectric layer on the donor wafer is suitably performed at a temperature low enough to prevent premature separation or cleaving along plane 17 in the donor layer (i.e., prior to the wafer bonding process step). The separation or cleaving temperature is a complex function of the implanted species, implanted dose, and implanted material. However, typically, premature separation or cleaving may be avoided by maintaining a deposition or growth temperature below about 500° C.

Figure 2:
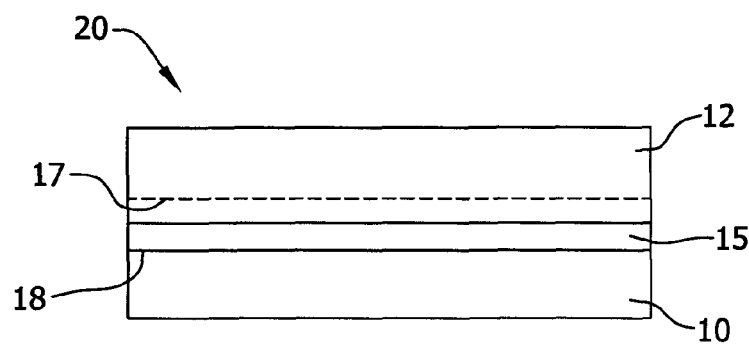
FIG. 2 is a cross-section view of the donor wafer and dielectric layer bonded to a handle wafer.

Referring now to FIG. 2, the front surface of the dielectric layer 15 is then bonded to the front surface of a handle wafer 10 to form a bonded wafer 20 through a hydrophilic bonding process. The dielectric layer 15 and handle wafer 10 may be bonded together by exposing the surfaces of the wafers to a plasma containing, for example, oxygen or nitrogen. Exposure to the plasma modifies the structure of the surfaces in a process often referred to as surface activation. The wafers are then pressed together and a bond at the bond interface 18 is formed therebetween.

Prior to bonding, the surfaces of the dielectric layer and handle wafer may optionally undergo cleaning and/or a brief etching, planarization, or plasma activation to prepare their surfaces for bonding using techniques known in the art. Without being held to a particular theory, it is generally believed that the quality of the silicon surface of the SOI structure is, in part, a function of the quality of the surface prior to bonding. Additionally, the quality of both surfaces prior to bonding will have a direct impact on the quality or strength of the resulting bond interface.

In some instances, therefore, the dielectric layer and/or handle wafer may be subjected to one or more of the following procedures in order to obtain, for example, a low surface roughness (e.g., a roughness of less than about 0.5 nm root mean square (RMS)) prior to bonding: (i) planarization by, for example, CMP and/or (ii) cleaning by, for example, a wet chemical cleaning procedure, such as a hydrophilic surface preparation process (e.g., an RCA SC-1 clean process wherein the surfaces are contacted with a solution containing ammonium hydroxide, hydrogen peroxide, and water at a ratio of, for example, 1:2:50 at about 65° C. for about 20 minutes, followed by a deionized water rinse and drying). One or both of the surfaces may also optionally be subjected to a plasma activation after, or instead of, the wet cleaning process to increase the resulting bond strength. The plasma environment may include, for example, oxygen, ammonia, argon, nitrogen, diborane, or phosphine.

Generally speaking, wafer bonding may be achieved using essentially any technique known in the art, provided the energy employed to achieve formation of the bond interface is sufficient to ensure that the integrity of the bond interface is sustained during subsequent processing (i.e., layer transfer by separation along the cleave or separation plane 17 in the donor wafer). Typically, however, wafer bonding is achieved by contacting the surface of the dielectric layer and the handle wafer at a reduced pressure (e.g., about 50 mTorr) and at room temperature, followed by heating at an elevated temperature (e.g., at least about 200° C., at least about 300° C., at least about 400° C., or even at least about 500° C.) for a sufficient period of time (e.g., at least about 10 seconds, at least about 1 minute, at least about 15 minutes, at least about 1 hour or even at least about 3 hours). For example, the heating may take place at about 350° C. for about 1 hour. The resulting interface may have a bond strength that is greater than about 500 mJ/m$^2$, greater than about 1000 mJ/m$^2$, greater than about 1500 mJ/m$^2$, or even greater than about 2000 mJ/m$^2$. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the ions earlier implanted in the donor wafer weaken the cleave plane. A portion of the donor wafer is then separated (i.e., cleaved) along the cleave plane from the bonded wafer to form the SOI structure.

Figure 3:
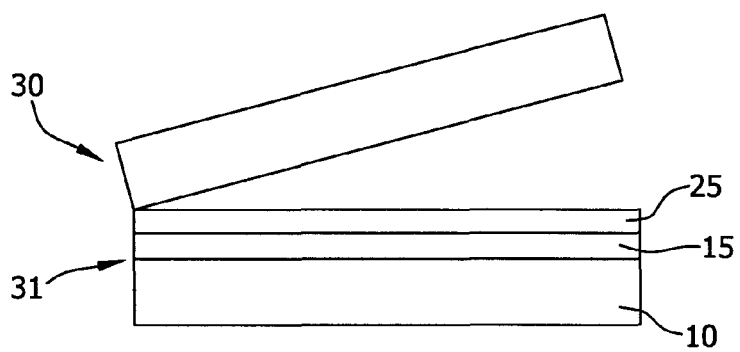
FIG. 3 is a cross-section view of the SOI structure upon cleaving the donor wafer at the cleave plane.

After the bond interface has been formed, the resulting bonded structure is subjected to conditions sufficient to induce a fracture along the separation or cleave plane within the donor wafer (FIG. 3). Generally speaking, this fracture may be achieved using techniques known in the art, such as thermally and/or mechanically induced cleaving techniques. Typically, however, fracturing is achieved by annealing the bonded structure at a temperature of at least about 200° C., at least about 300° C., at least about 400° C., at least about 500° C., at least about 600° C., at least about 700° C. or even at least about 800° C. (the temperature being in the range of, for example, about 200° C. to about 800° C., or from about 250° C. to about 650° C.) for a period of at least about 10 seconds, at least about 1 minute, at least about 15 minutes, at least about 1 hour or even at least about 3 hours (with higher temperatures requiring shorter anneal times, and vice versa), under an inert (e.g., argon or nitrogen) atmosphere or ambient conditions.

In this regard it is to be noted that in an alternative embodiment, this separation may be induced or achieved by means of mechanical force, either alone or in addition to annealing. For instance, the bonded wafer may be placed in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming a SOI structure.

Referring to FIG. 3, upon separation, two structures 30, 31 are formed. Since the separation of the bonded structure 20 occurs along the cleave plane 17 in the donor wafer 12 (FIG. 2), a portion of the donor wafer remains part of both structures (i.e., a portion of the donor wafer is transferred along with the dielectric layer). Structure 30 comprises a portion of the donor wafer. Structure 31 is the silicon on insulator structure and includes the handle wafer 16, the dielectric layer 15, and a silicon layer 25.

The resulting SOI structure 31 includes a thin layer of silicon 25 (the portion of the donor wafer remaining after cleaving) disposed atop the dielectric layer 15 and the handle wafer 10. The cleave surface of the SOI structure (i.e., the thin layer of silicon of the donor wafer) has a rough surface that may be smoothed by additional processing. The structure 31 may be subjected to additional processing to produce a silicon layer surface having desirable features for device fabrication thereon. Such features include, for example, reduced surface roughness, and/or a reduced concentration of light point defects.

In accordance with the present disclosure, the donor wafer and/or the handle wafer used to prepare the SOI structure have a roll-off amount (ROA) less than conventional donor and/or handle wafers to improve the bonding between the dielectric layer and the handle wafer at the peripheral edge portions of the bonded structure. ROA may generally be determined by well known industry measurement protocols. Particularly, ROA may be measured using the height data profile as disclosed by M. Kimura et al., "A New Method for the Precise Measurement of Wafer Roll off of Silicon Polished Wafer," Jpn. Jo. Appl. Phys., vol. 38, pp. 38-39 (1999), which is incorporated herein by reference for all relevant and consistent purposes. Generally, the methods of Kimura have been standardized by the industry as by, for example, SEMI M69: Practice for Determining Wafer Near-Edge Geometry using Roll-off Amount, ROA (Preliminary) (2007) which is also incorporated herein by reference for all relevant and consistent purposes. Most commercially available wafer-inspection instruments are pre-programmed to calculate ROA. For instance ROA may be determined by use of a KLA-Tencor Wafer Inspection System using WaferSight analysis hardware (Milpitas, Calif.).

Figure 4:
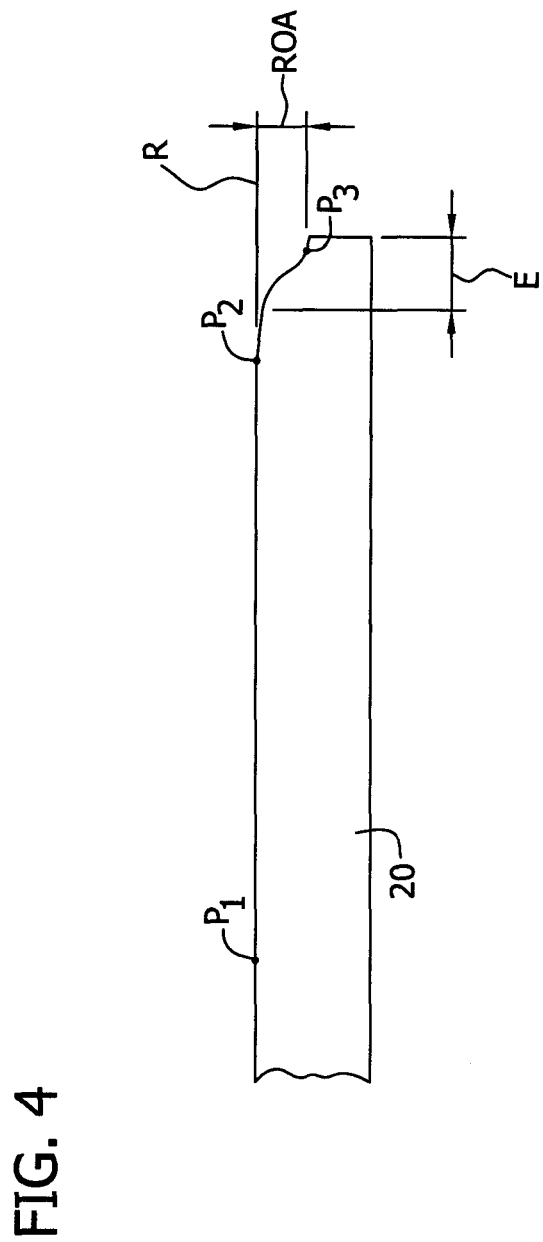
FIG. 4 is a cross-section view of a wafer schematically showing measurement of ROA.

With reference to FIG. 4, ROA of a wafer 20 is generally determined by reference to three points ($P_1$, $P_2$ and $P_3$) along a wafer radius. A reference line R is fitted between two points ($P_1$, $P_2$) and the third point ($P_3$) lies within an annular edge portion E of the wafer where roll-off is conventionally observed. The ROA is the distance between the reference line R and the third point $P_3$. The annular edge portion E of the wafer generally extends from a point about 98% of the radius of the wafer to the edge of the wafer. For instance, in a 300 mm diameter wafer, the annular edge portion starts at about 147 mm from the central axis of the wafer and extends to the wafer edge. The reference line R may be fitted as a first order linear line or a third order polynomial. For purposes of the present disclosure, the reference line is fitted as a first order linear line unless stated differently.

In this regard, ROA may be expressed in terms of front surface ROA, back surface ROA or thickness ROA (i.e., using an average thickness profile). Front surface ROA and back surface ROA measurements involve fitting a best-fit reference line R between $P_1$ and $P_2$ along the respective front or back surface and thickness ROA involves fitting a best fit line for the various wafer 20 thicknesses between $P_1$ and $P_2$ (i.e., the thickness ROA takes into account both the front and back surface). Roll-off amounts recited herein are thickness ROA measurements unless stated otherwise.

While any of three points may be chosen to determine ROA, one common method used in the art includes using a first point that is about 82.7% of the radius of the wafer from the central axis of the wafer and a second point that is about 93.3% of the radius from the central axis of the wafer to form the reference line R. These points are about 124 mm and 140 mm from the central axis of the wafer in a 300 mm diameter wafer. A third point about 99.3% of the radius of the wafer from the central axis (i.e., at about 149 mm from the central axis for a 300 mm diameter wafer) may be used with the distance between the reference line and the third point being ROA. ROA may be measured across several radii of the wafer and averaged. For instance, the ROA of 2, 4 or 8 radii angularly spaced across the wafer may be measured and averaged. For instance, ROA may be measured by averaging the ROA of eight radii (e.g., the eight radii at 0°, 45°, 90°, 135°, 180°, 225°, 275° and 315° in the R-θ coordinate system as described in SEMI M69).

As described above, the ROA measurement may involve the front surface profile, back surface profile or thickness profile. In this regard, "ROA" as used herein refers to the ROA measured by use of the best-fit thickness profile (i.e., thickness ROA rather than a front surface ROA) of the wafer with a linear first order line being established between 84% and 93.3% of the radius of the wafer and with the reference point in the annular edge portion of the wafer being at 99.3% of the radius, unless stated otherwise. In this regard, it has been found that the thickness ROA better correlates to improved bonding in the bonded structure and to the distance to which the silicon layer extends to the wafer edge in the resulting SOI structure as compared to the front surface ROA (Examples 1 and 2).

It should be understood that ROA, in regard to the thickness profile, may be a positive number in which the wafer becomes thicker in its peripheral edge portion or may be a negative number in which the wafer becomes less thick in its peripheral edge portion. In this regard, use of the phrase "less than" herein in relation to an ROA amount (either negative or positive) indicates that the ROA is in a range from the recited amount to about 0 (e.g., an ROA of "less than about −700 nm" refers to an ROA range of about −700 nm to about 0 and an ROA of "less than about 700 nm" refers to an ROA in the range of about 700 nm to about 0). Additionally, use of the phrase "greater than" in relation to an ROA amount (either negative or positive) includes roll-off amounts in which the edge portion of the wafer is further away from the axial center of the wafer than the recited amount.

In accordance with embodiments of the present disclosure, the donor wafer upon which the dielectric layer is deposited or grown (or, as in some embodiments, upon which the dielectric layer is bonded) has an ROA of less than about −700 nm. In other embodiments, the ROA of the donor wafer is less than about −600 nm, less than about −500 nm, less than about −400 nm, less than about −300 nm, less than about −250 nm or from about −10 nm to about −700 nm, from about −50 nm to about −600 nm, from about −100 nm to about −500 nm, from about −100 nm to about −400 nm or from about −100 nm to about −300 nm.

Alternatively or in addition, the handle wafer to which the dielectric layer and donor wafer are attached (or, as in some embodiments, upon which the dielectric layer is deposited) has an ROA of less than about −700 nm. In other embodiments, the ROA of the handle wafer is less than about −600 nm, less than about −500 nm, less than about −400 nm, less than about −300 nm, less than about −250 nm or from about −10 nm to about −700 nm, from about −50 nm to about −600 nm, from about −100 nm to about −500 nm, from about −100 nm to about −400 nm or from about −100 nm to about −300 nm.

In this regard, while the roll-off amounts recited herein are typically negative roll-off amounts, the roll-off of the handle or donor wafer may be positive without limitation (e.g., less than about 400 nm, less than about 200 nm, less than about 100 nm, from about −700 nm to about 400 nm or from about −700 nm to about 100 nm). Further, in certain embodiments, ROA amounts other than as recited may be used without limitation.

It has also been found that, in addition to the thickness ROA, the second-derivative ("zdd") of the front surface shape of the donor and/or handle wafer correlates well to improved bonding at the bonded structure periphery. Accordingly, the second derivative ("zdd") may be less than about −1100 $nm/mm^2$, less than about −800 $nm/mm^2$, less than about −600 $nm/mm^2$ or even less than about −400 $nm/mm^2$ (e.g., from about −1110 $nm/mm^2$ to about −100 $nm/mm^2$ or from about −800 $nm/mm^2$ to about −200 $nm/mm^2$). It should be understood that zdd may be a positive number in which the edges of the wafer roll up (i.e., away from the axial center of the wafer) or a negative number in which the edges of the wafer roll down (i.e., toward the axial center of the wafer). In this regard, use of the phrase "less than" herein in relation to a second derivative amount indicates that the second derivative ("zdd") is in a range from the recited amount to about 0 (e.g., a zdd of "less than about −1100 $nm/mm^2$" refers to a zdd in the range of about −1100 $nm/mm^2$ nm to about 0). The zdd may be measured across several radii of the wafer and averaged. The second derivative may also be measured by dividing the wafer into several sectors (e.g., 2, 4, 8 or 16 sectors) and calculating an average front-side profile for each sector. The zdd may be determined for the average front-side profile of each sector and then the sector second derivatives may be averaged. In this regard, the zdd amounts recited herein are determined by averaging the zdd for 16 wafer sectors unless stated otherwise.

By reducing the ROA of the handle and/or donor wafers, bonding between the dielectric layer and the handle wafer at the peripheral edge portions of the bonded structure is improved (i.e., voids are reduced, bonded area is increased, and bonding extends closer to the circumferential edge) as compared to bonded structures that are produced from conventional handle and donor wafers. As a result of the improved bonding, the silicon layer of the resulting SOI structure extends closer to the edge of the handle wafer to which it is bonded after cleaving. In the bonded structure (i.e., before cleaving), the dielectric layer is at least partially bonded to the handle wafer such that bonds extend from the central axis of the bonded silicon on insulator structure to a point at least about 98.9% of the radius of the bonded silicon on insulator structure and, in some embodiments, to a point at least about 99.2% of the radius, to a point at least about 99.4% of the radius or to a point at least about 99.6% of the radius of the bonded silicon on insulator structure (e.g., to a point from about 98.9% to about 99.9% of the radius, from about 99.2% to about 99.9% or to a point from about 99.5% to about 99.9% of the radius of the bonded silicon on insulator structure). For instance, in a 300 mm bonded silicon on insulator structure, bonds between the dielectric layer and the handle wafer may extend from the central axis of the structure to about 148.35 mm from the central axis of the bonded structure or to at least about 148.8 mm, at least about 149.4 mm from the central axis (e.g., from about 148.35 mm to about 149.85 mm, from about 148.8 mm to about 149.85 mm or from about 149.25 mm to about 149.85 mm). To determine the extent to which bonding occurs in the bonded structure, the bonded wafer may be cleaved in half and analyzed or the resulting SOI structure may be analyzed for the presence of the silicon layer. In this regard, the phrase "at least partially bonded" may include arrangements in which bonds extend to the circumferential edge of the handle and/or donor wafer unless stated otherwise. In this regard it should be understood that, in certain embodiments, the radius of the handle wafer may differ from that of the dielectric layer and/or the silicon layer (e.g., in the SOI structure after cleaving as a result of partial bonding) and, as used herein, the "radius of the SOI structure" refers to the radius of the handle wafer unless stated otherwise.

This increase in peripheral bonding in the bonded structure allows the silicon layer and the dielectric layer to extend closer to the circumferential edge of the handle wafer to which they are bonded in the resulting SOI structure. In several exemplary embodiments, the resulting SOI structure includes a silicon layer (and typically also a dielectric layer) that extends from the central axis of the handle wafer to a point at least about 98.9% of the radius of the handle wafer and, in some embodiments, to a point at least about 99.2% of the radius, to a point at least about 99.4% of the radius or to a point at least about 99.6% of the radius of the handle wafer (e.g., to a point from about 98.9% to about 99.9% of the radius, from about 99.2% to about 99.9% or to a point from about 99.5% to about 99.9% of the radius of the handle wafer). For instance, in a 300 mm SOI structure, the silicon layer extends about 148.35 mm from the central axis of the handle wafer or to at least about 148.8 mm, at least about 149.1 mm or at least about 149.4 mm from the central axis of the handle wafer (e.g., from about 148.35 mm to about 149.85 mm, from about 148.8 mm to about 149.85 mm or from about 149.25 mm to about 149.85 mm).

Figure 5:
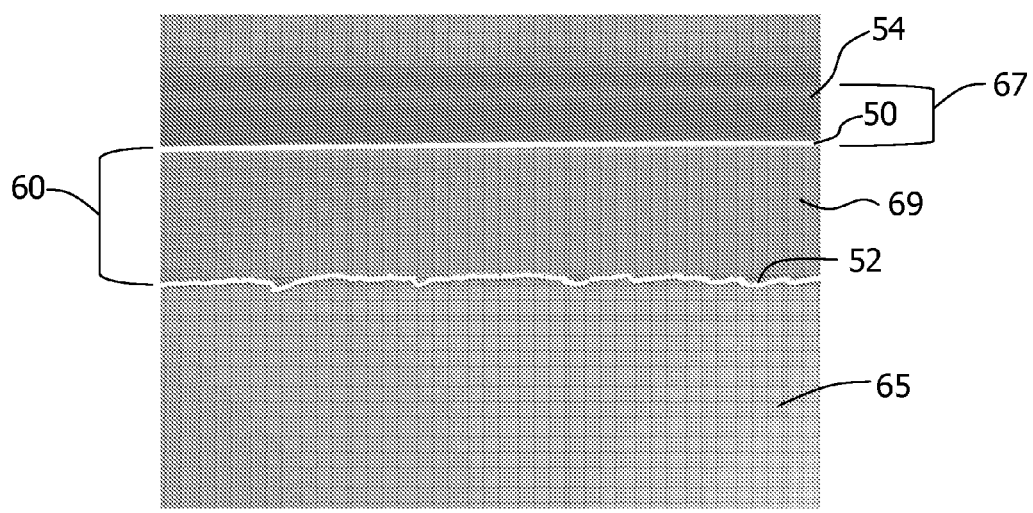
FIG. 5 is a top view image of a SOI structure produced by a polishing and cleaning method of the present disclosure showing the unbonded region in which the silicon layer does not extend to the edge of the handle wafer.

The extent to which the silicon layer extends to the edge of the handle wafer may be determined by, for example, viewing the structure under an optical microscope (e.g., with a 5× objective) such as a Nomarski differential interference contrast (DIC) microscope. An exemplary image of the top of an SOI structure is shown in FIG. 5. The SOI structure is partially covered by the silicon layer 65. The structure includes an unbonded portion 69 that extends from the edge 52 of the silicon layer 65 to the edge 50 of the wafer (i.e., the surface of the handle wafer may be seen in the unbonded region 69).

In this regard, it should be understood that, as used herein, the width 60 of the unbonded portion 69 does not include the beveled region 67 of the wafer. The beveled portion 67 extends from the wafer apex 54 which appears as a light band in the image to a change in contrast referenced by numeral "50." Stated differently, the unbonded region 69 extends from the edge 50 of the beveled region to the edge 52 of the silicon layer 65 rather than from the apex 54 to the silicon wafer edge 52. The dark region above the apex 54 is a shadow produced during microscopy and does not form part of the wafer.

In addition to having relatively low ROA, handle and donor wafers used in the SOI structure may also be characterized as having a low amount of brightfield defects on the front surface of the respective wafers. Brightfield defects on the surface of the donor wafer and/or handle wafer weaken the bond between the donor and handle wafer at the site of the defect and cause voids to form in the SOI silicon layer. It has been found that the wafer polishing and cleaning sequences described below result in a wafer with about 3 or less brightfield defects of a size greater than about 6 nm on the front surface of the wafer and, in some embodiments, about 2 or less, about 1 or less or even no brightfield defects of a size greater than about 6 nm. Alternatively or additionally, the wafer may have less than about 6 brightfield defects of a size greater than about 4.8 nm or less than about 4, less than about 2 or even is free of brightfield defects of a size greater than about 4.8 nm at the front surface of the wafer.

In some particular embodiments, the surface of the wafer does not contain any observable brightfield defects of a size greater than about 6 nm and has an ROA of less than about −700 nm (e.g., less than about −600 nm, less than about −500 nm, less than about −400 nm, less than about −300 nm or less than about −250 nm). While the polishing and cleaning methods described below are described with reference to handle and/or donor wafers, they may be applied to wafers generally including, for example, bulk single crystal silicon wafers. The methods generally result in low ROA wafers that are further characterized as having low amounts of brightfield defects (e.g., no brightfield defects greater than 6 nm in size).

The resulting SOI structures may also be characterized by reduced amounts of brightfield defects at the interfaces between the various layers which results in stronger bonds between the various layers of the structure and causes less voids to form in the silicon device layer. The SOI structure includes an interface between the dielectric layer and the handle wafer and an interface between the dielectric layer and the silicon layer. In various embodiments, the handle wafer may have about 3 or less brightfield defects of a size greater than about 6 nm at the interface with the dielectric layer or, as in other embodiments, about 2 or less, about 1 or less or even is free of brightfield defects of a size greater than 6 nm at the interface with the dielectric layer. In these and in other embodiments, the handle wafer may have less than about 6 brightfield defects of a size greater than about 4.8 nm or less than about 4, less than about 2 or even is free of brightfield defects of a size greater than about 4.8 nm at the interface with the dielectric layer.

Alternatively or in addition, the silicon layer may have about 3 or less brightfield defects of a size greater than about 6 nm at the interface with the dielectric layer or have about 2 or less, about 1 or less or even is free of brightfield defects of a size greater than 6 nm. In these and in other embodiments, the silicon layer may have less than about 6 brightfield defects of a size greater than about 4.8 nm or less than about 4, less than about 2 or even is free of brightfield defects of a size greater than about 4.8 nm at the interface with the dielectric layer.

The detection of brightfield defects may be performed by conventional techniques known to those of skill in the art. Suitably, brightfield wafer inspection tools or darkfield inspection tools having a brightfield detector such as a KLA Tencor Surfscan SP2 wafer inspection system may be used to detect brightfield defects.

The SOI structure formed after cleaving the donor wafer at the cleave plane may be characterized with ROA's at the various wafer interfaces that are substantially similar to the ROA of the handle wafer and/or donor wafer which are used to produce the SOI structure. The handle wafer may have an ROA of less than about −700 nm at the interface with the dielectric layer and, in other embodiments, less than about −600 nm, less than about −500 nm, less than about −400 nm, less than about −300 nm, less than about −250 nm or from about −10 nm to about −700 nm, from about −50 nm to about −600 nm, from about −100 nm to about −500 nm, from about −100 nm to about −400 nm or from about −100 nm to about −300 nm at the interface with the dielectric layer.

The donor and/or handle wafers used to produce the SOI structure may be obtained by slicing the wafers from ingots formed by the Czochralski process and subjecting the wafers to further processing. For instance, the wafers may be subjected to a "rough" polish and a "finish" polish. Advantageously, methods for preparing handle and donor wafers with relatively low ROA and with very few brightfield defects, or with no brightfield defects, have been found.

In one or more embodiments for preparing the donor and/or handle wafer, a first polishing step is performed in which the front surface and optionally the back surface are polished (i.e., a double-side polish is performed). Generally, the polish is a "rough" polish that reduces the surface roughness of the wafer (e.g., donor, handle or bulk wafer) to less than about 3.5 Å to even as low as about 2.5 Å or even about 2 Å as measured with an atomic force microscope (AFM) at scan sizes of about 1 μm×about 1 μm to about 100 μm×about 100 μm. For purposes of this specification, surface roughness is expressed as the root mean square (RMS) unless indicated otherwise. Rough polishing typically results in removal of about 1 μm to about 20 μm and, more typically, from about 5 μm to about 15 μm of material from the surface of the wafer.

The rough polish (and the finish polish described below) may be achieved by, for example, chemical-mechanical planarization (CMP). CMP typically involves the immersion of the wafer in an abrasive slurry and polishing of the wafer by a polymeric pad. Through a combination of chemical and mechanical means the surface of the wafer is smoothed. Typically the polish is performed until a chemical and thermal steady state is achieved and until the wafers have achieved their targeted shape and flatness. The rough polish may be performed on a double-side polisher commercially available from Peter Wolters (e.g., AC2000 polisher; Rendsburg, Germany), Fujikoshi (Tokyo, Japan), Speedfam (Kanagawa, Japan) or Lapmaster SFT (e.g., LGP-708, Chiyoda-Ku, Japan). Stock removal pads for silicon polishing are available from Psiloquest (Orlando, Fla.) and Rohm & Haas (Philadelphia, Pa.) and silica based slurries may be purchased from Rohm & Haas, Cabot (Boston, Mass.), Nalco (Naperville, Ill.), Bayer MaterialScience (Leverkusen, Germany) and DA NanoMaterials (Tempe, Ariz.).

The rough polishing step may occur for about 300 to about 600 seconds and at a pad pressure of from about 150 g/cm$^2$ to about 700 g/cm$^2$ with a slurry flow rate of about 75 g/cm$^2$ to about 125 g/cm$^2$. However, it should be understood that other polish times, pad pressures and slurry flow rates may be used without departing from the scope of the present disclosure.

After the rough polish is complete, the wafers may be rinsed and dried. In addition, the wafers may be subjected to a wet bench or spin cleaning Wet bench cleaning may include contacting the wafers with SC-1 cleaning solution (i.e., ammonium hydroxide and hydrogen peroxide), optionally, at elevated temperatures (e.g., about 50° C. to about 80° C.). Spin cleaning includes contact with a HF solution and ozonated water and may be performed at room temperature.

After cleaning, a second polishing step may be performed. The second polishing step is typically a finish polish. The finish polish reduces the surface roughness of the wafer (e.g., handle, donor or bulk wafer) to less than about 2.0 Å as measured by an AFM at scan sizes of about 10 μm×about 10 μm to about 100 μm×about 100 μm. The finish polish may even reduce the surface roughness to less than about 1.5 Å or less than about 1.2 Å at scan sizes of about 10 μm×about 10 μm to about 100 μm×about 100 μm. Finish polishes remove only about 0.5 μm or less of material from the surface layer.

Suitable polishers for finish polishing may be obtained from Lapmaster SFT (e.g., LGP-708, Chiyoda-Ku, Japan). In accordance with embodiments of the present disclosure, the pad used for finish polishing is a suede-type pad (also referred to as a polyurethane foam pad) such as a SURFIN pad from Fujimi (Kiyoso, Japan), a CIEGAL pad from Chiyoda KK (Osaka, Japan) or a SPM pad from Rohm and Haas. In this regard, it should be noted that for purposes of the present disclosure, as referred to herein, "polyurethane foam pads" do not include polyurethane impregnated polyethylene pads such as SUBA pads available from Rohm and Haas. However, SUBA pads may be used in other embodiments without departing from the scope of the present disclosure. In addition to the use of a polyurethane foam pad, the polishing slurry that is used may be a solution of colloidal silica (e.g., a mixture of Syton-HT50; Du Pont Air Products NanoMaterials (Tempe, Ariz.) and caustic solution (e.g., KOH); or Glanzox 3900 from Fujimi). In some embodiments, a mixture of Syton-HT50 and caustic may be used in a first step of the finish polish and Glanzox 3900 used in a second step. In this regard it should be noted that the polyurethane foam pad and colloidal silica solutions used for finish polishing may also be used for rough polishing; however, other stock pads and slurries may be used for rough polishing without departing from the scope of the present disclosure.

The finish polish may occur for at least about 60 seconds or even about 90, 120 or 180 seconds. The slurry flow rate may range from about 500 ml/min to about 750 ml/min and the pad pressure may range from about 75 g/cm$^2$ to about 125 g/cm$^2$; however, it should be understood that other polish times, pad pressures and slurry flow rates may be used without departing from the scope of the present disclosure.

Generally, the polishing and cleaning steps described above produce wafers with a relative low ROA on their front surface (e.g., less than about −700 nm, less than about −600 nm, less than about −500 nm, less than about −400 nm, less than about −300 nm, less than about −250 nm or from about −10 nm to about −700 nm, from about −50 nm to about −600 nm, from about −100 nm to about −500 nm, from about −100 nm to about −400 nm or from about −100 nm to about −300) and with relatively few brightfield defects on their front surface (e.g., about 3 or less brightfield defects of a size greater than about 6 nm on the surface of the wafer or about 2 or less, about 1 or less or even no brightfield defects of a size greater than about 6 nm and/or less than about 6 brightfield defects of a size greater than about 4.8 nm at their front surface or less than about 4, less than about 2 or even no brightfield defects of a size greater than about 4.8 nm). It should also be understood that while the polishing and cleaning process of the present disclosure and the roll-off amounts and brightfield defect amounts recited herein are typically described in relation to a handle wafer or donor wafer used to produce an SOI structure, the methods may be used to produce a bulk single crystal silicon wafer and the wafer may be characterized by the recited roll-off amounts and brightfield defects. Further, in certain embodiments, a population of wafers (e.g., a collection of wafers in a storage unit such as cassette of wafers) may be provided in which each of the wafers is characterized by the roll-off amounts and amounts of brightfield defects recited above. The population of wafers may include at least about 10 wafers, at least about 25 wafers, at least about 50 wafers, at least about 100 wafers or even at least about 1000 wafers.

EXAMPLES

Example 1

Unbonded Width of SOI Structures with Variable ROA

Six 300 mm SOI structures were prepared by bonding a handle wafer to a donor wafer with a dielectric layer (145 nm thick) on the surface of the donor wafer followed by cleaving along a cleave plane formed within the donor wafer. The cleave plane was formed in the donor wafer by implanting $He^+$ ions at an energy of 36 keV and a dose of $1 \times 10^{16}$ ions/$cm^2$ followed by implanting $H_2^+$ ions at an energy of 48 keV and a dose of $5 \times 10^{15}$ ions/$cm^2$ (Quantum H Implanter (model Q843), Applied Materials (Santa Clara, Calif.)). Cleaving was performed by heating to 350° C. (A412 Furnace, ASM (Almere, The Netherlands)).

One pair of SOI structures was prepared from donor and handle wafers each having a thickness ROA of about −800 nm. Another pair was made from handle wafers with a thickness ROA of about −800 nm and donor wafers of about −200 nm. Another pair was made from handle and donor wafers each having a thickness ROA of about −200 nm. All donor and/or handle wafers that had a thickness ROA of about −200 nm were prepared by rough polishing with a polyurethane foam pad, followed by cleaning and then finish polishing with a polyurethane foam pad. ROA was measured by use of KLA-Tencor WaferSight Analysis software and was determined by determining the wafer thickness profile and fitting a first order line between a point 124 mm and a point 140 mm from the center of the structure in the average thickness profile and by determining the distance between the reference line and a point 149 mm from the center.

Figure 7:
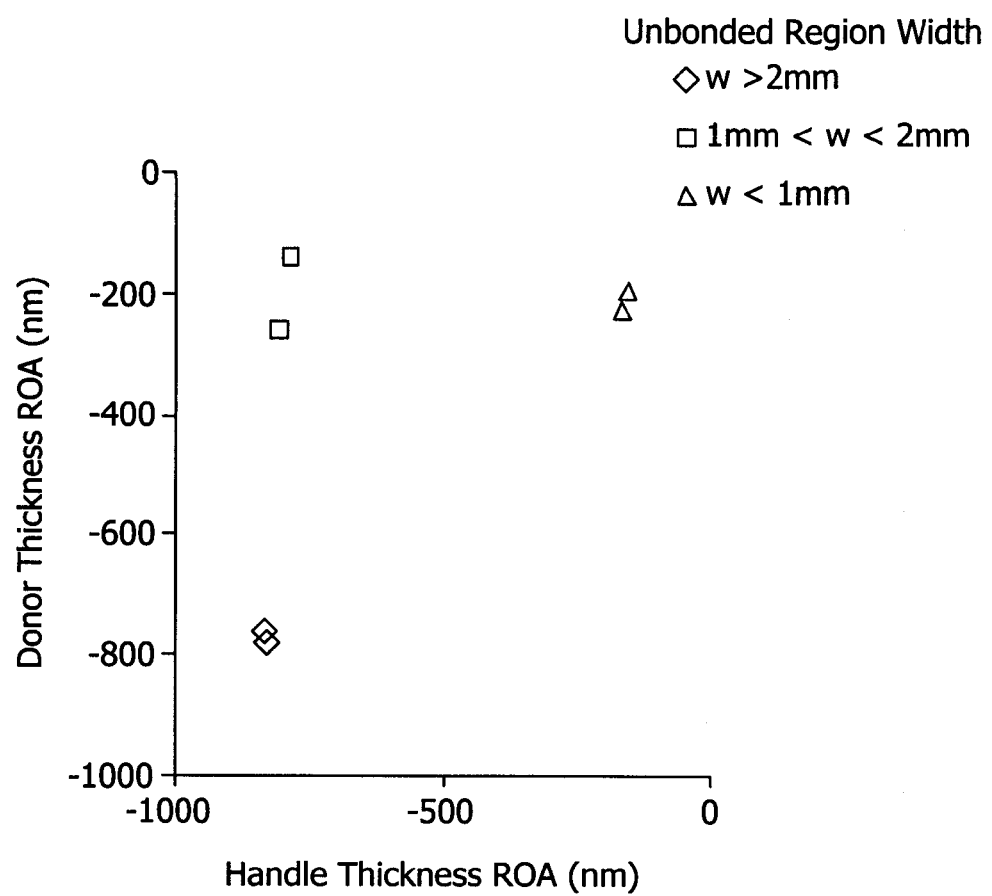
FIG. 7 is a graph showing the thickness ROA of the donor and handle wafers for various SOI structures produced according to Example 1 and the width of the unbonded region for each structure.

FIG. 7 graphically illustrates the unbonded region width for the wafers described above as a function of thickness ROA. As can be seen from FIG. 7, the dielectric layer of the SOI wafers made from handle and donor wafers with a thickness ROA of about −200 nm extended to less than about 1 mm (specifically to 0.71 mm and 0.62 mm, respectively) from the edge of the handle wafer (i.e., "Unbonded Region Width") while the other SOI structures had much larger unbonded widths.

Figure 8:
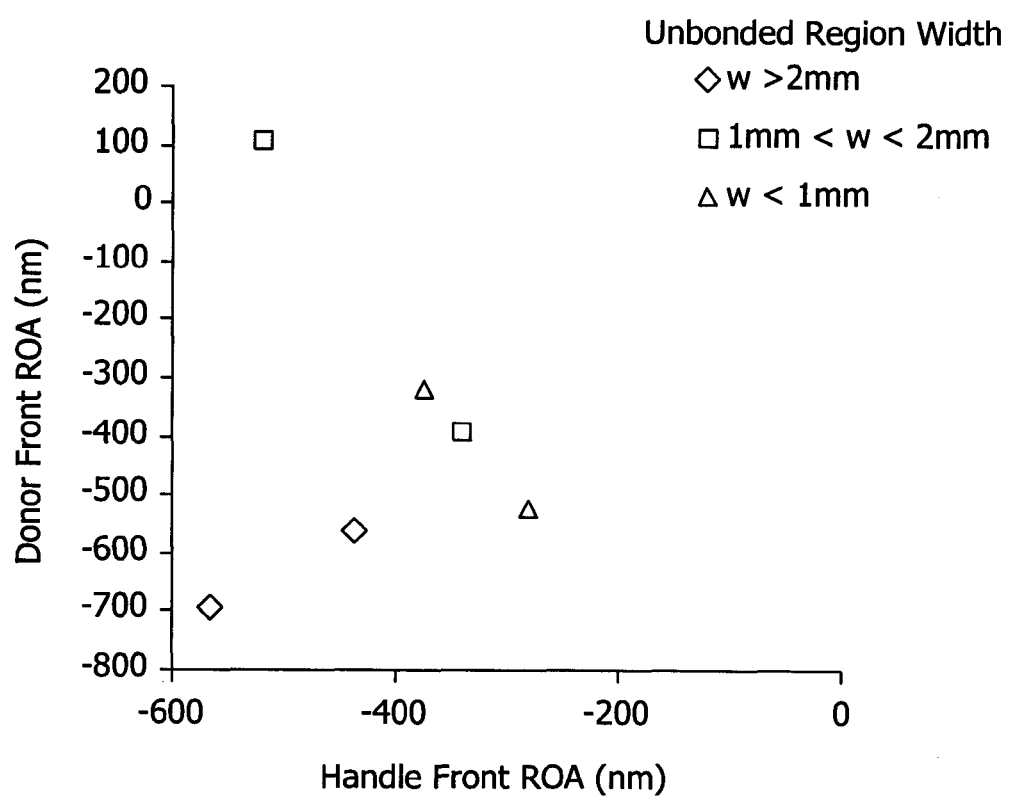
FIG. 8 is a graph showing the front surface ROA of the donor and handle wafers for various SOI structures produced according to Example 1 and the width of the unbonded region for each structure.
Figure 9:
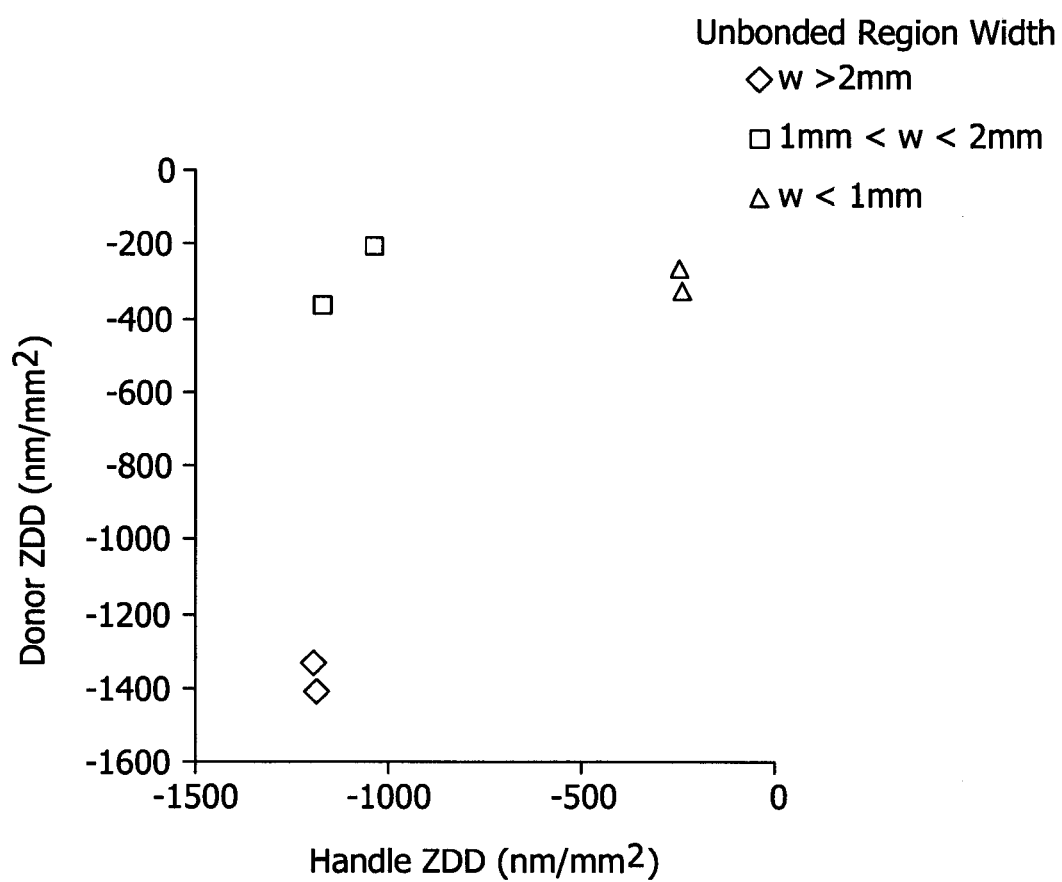
FIG. 9 is a graph showing the front surface shape second derivative (zdd) of the donor and handle wafers for various SOI structures produced according to Example 1 and the width of the unbonded region for each structure.

FIG. 8 graphically illustrates the unbonded region width for the wafers described above as a function of front surface ROA and FIG. 9 illustrates the unbonded region width as a function of the second derivative of the front surface shape (zdd). As can be seen from the Figures, the front surface ROA does not correlate well to the unbonded width and the front surface second derivative does correlate well.

Example 2

Comparison of Unbonded Width in SOI Structures Prepared from New and Conventional Donor Wafers and/or Handle Wafers Four sets of 300 mm SOI structures were prepared from the various combinations of donor and handle wafers shown below:
  (a) conventional donor and conventional handle wafer (i.e., no cleaning step between rough polish and finish polish for donor or handle wafer);
  (b) new donor wafer (rough polish with a polyurethane foam pad followed by a cleaning step followed by finish polish with a polyurethane foam pad) and conventional handle wafer;
  (c) new donor wafer and handle wafer made by unknown process; and
  (d) new donor wafer and new handle wafer.

Figure 10:
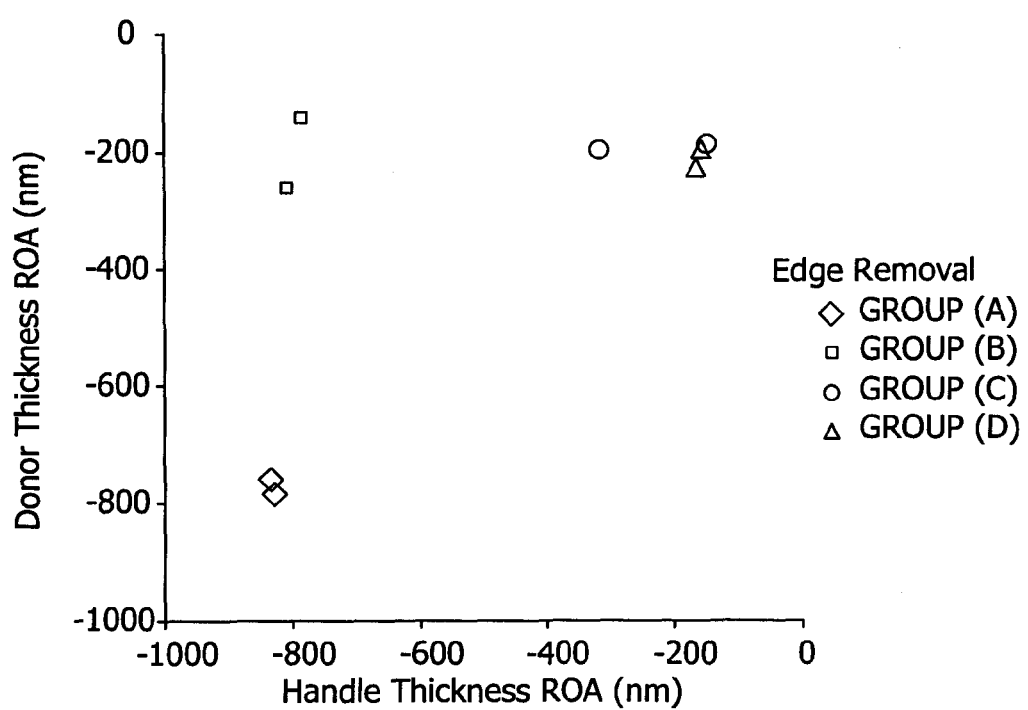
FIG. 10 is a graph showing the thickness ROA of the donor and handle wafers for various SOI structures produced according to Example 2 and the width of the unbonded region for each structure.
Figure 11:
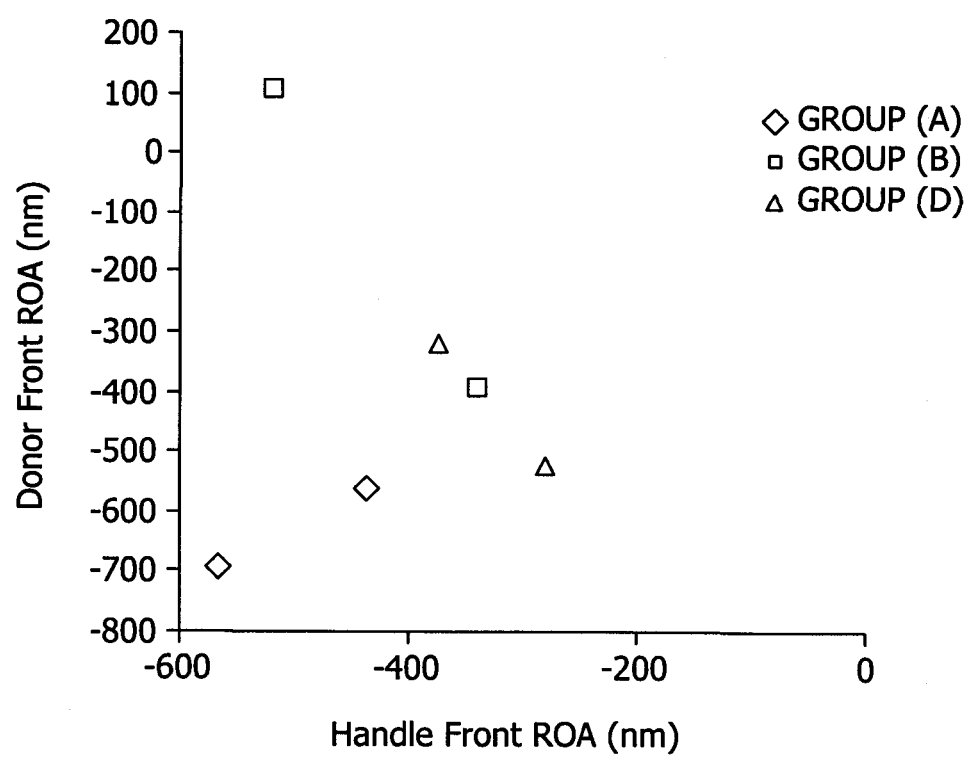
FIG. 11 is a graph showing the front surface ROA of the donor and handle wafers for various SOI structures produced according to Example 2 and the width of the unbonded region for each structure.
Figure 12:
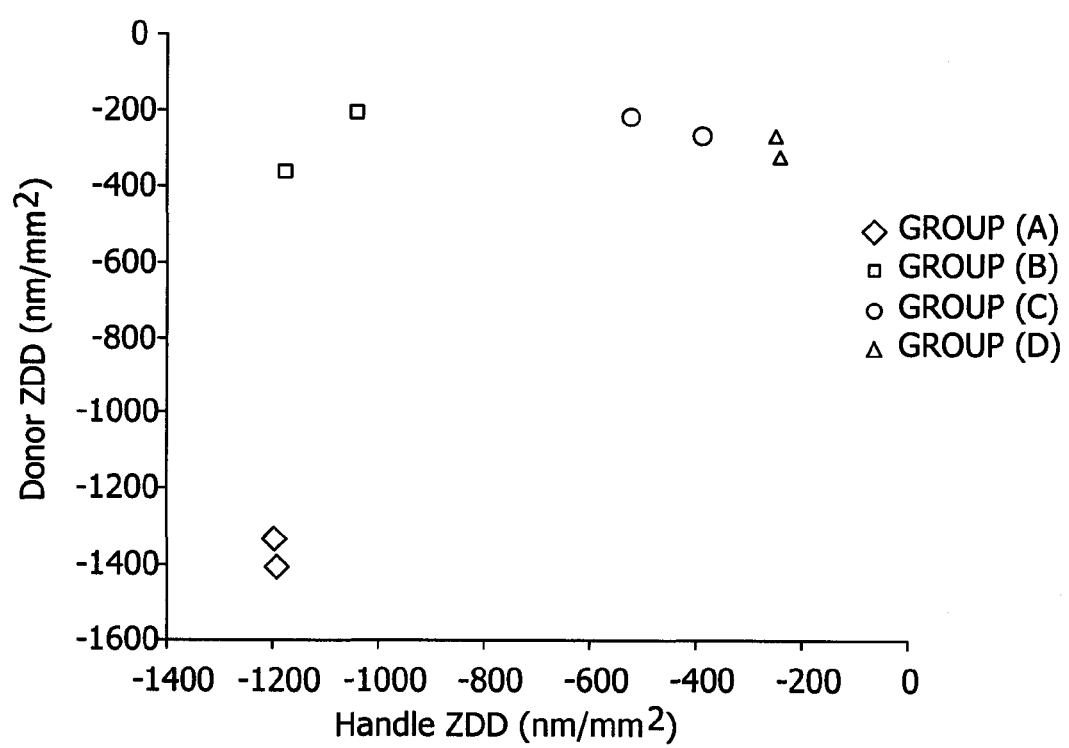
FIG. 12 is a graph showing the front surface shape second derivative of the donor and handle wafers for various SOI structures produced according to Example 2 and the width of the unbonded region for each structure.

Two wafers from each group (a)-(d) were analyzed to determine the thickness ROA, front surface ROA and second derivative of the front surface shape (zdd). The thickness ROA of wafer groups (a)-(d) are graphically illustrated in FIG. 10. The front surface ROA of wafer groups (a)-(d) are graphically shown in FIG. 11. The second derivative of the front surface shape of wafer groups (a)-(d) are graphically shown in FIG. 12. As can be seen from FIGS. 10-12, the thickness ROA (FIG. 10) and second derivative parameters (FIG. 12) bunch together and the front surface ROA (FIG. 11) is more dispersed. The average thickness ROA for the four conventional handle wafers (conventional wafers of Group A and Group B) was about −814 nm. The average thickness ROA for the two conventional donor wafers (Group A) was about −771 nm. The average thickness ROA for the six new donor wafers was (new donor wafers of Groups B, C and D) about −203 nm. The average thickness ROA for the new handle wafers (handle wafers of Group D) was −162 nm.

Each donor and handle wafer was composed of single crystal silicon grown by the Czochralski process. Each donor wafer and handle wafer that was prepared by the new process (rough polish with a polyurethane foam pad followed by a cleaning step followed by finish polish with a polyurethane foam pad) did not contain any brightfield defects of a size greater than about 6 nm and contained 2 or less of a size greater than about 4.8 nm.

Each SOI structure was prepared by forming a silicon oxide dielectric layer on the donor wafer and bonding the dielectric layer to the handle wafer. The donor wafer was cleaved by conventional methods to leave behind a silicon layer. Each SOI structure was analyzed on a Nikon Nomarski Optical Microscope to determine the width of the region in which the silicon device layer did not extend to the SOI structure edge (i.e., the peripheral edge of the handle wafer).

Figure 13:
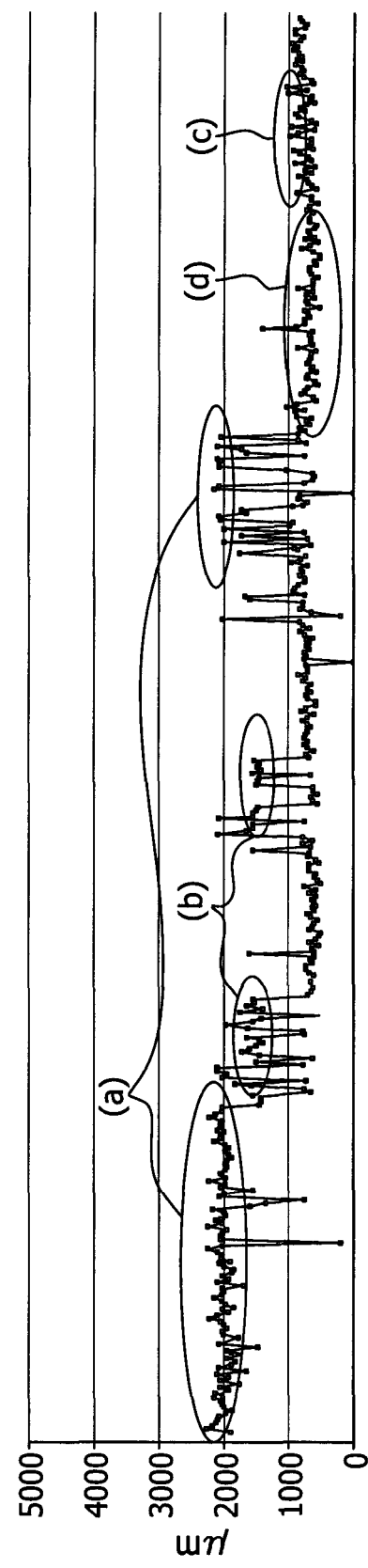
FIG. 13 is a graph showing the unbonded width of SOI structures produced according to Example 2.

As can be seen from FIG. 13, on average the SOI structures using conventional donor and handle wafers ((a)) had a silicon layer that extended from the center of the SOI structure to about 148.0 mm from the center (98.7% of the radius), the SOI structures produced using a new donor wafer and a conventional handle wafer ((b)) had a silicon layer that extended from the center of the SOI structure to about 148.5 mm from the center (99.0% of the radius), the SOI structures produced using a new donor wafer and a commercially obtained handle wafer ((c)) had a silicon layer that extended from the center of the SOI structure to about 149 mm from the center (99.3% of the radius) and the SOI structures produced using a new donor wafer and a new handle wafer ((d)) had a silicon layer that extended from the center of the SOI structure to about 149.3 mm from the center (99.5% of the radius). It can be seen that the new donor and/or handle wafers advantageously cause an increase in silicon layer radius thus increasing the usable area for device fabrication without increasing the number of brightfield defects to unacceptable levels (e.g., to an amount of 1 or more defects of a size of 6 nm or more or 3 or more brightfield defects of a size greater than 4.8 nm).

Figure 6:
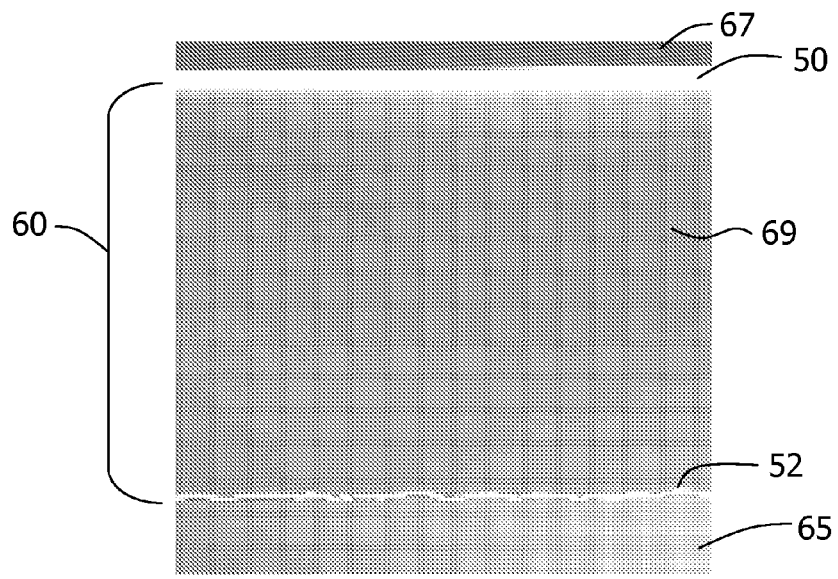
FIG. 6 is a top view image of a SOI structure produced by a conventional polishing method showing the unbonded region in which the silicon layer does not extend to the edge of the handle wafer.

A Nikon Nomarski Optical Microscope image of a SOI structure produced from a new donor wafer and new handle wafer (rough polish with a polyurethane foam pad followed by a cleaning step followed by finish polish with a polyurethane foam pad) is shown in FIG. 5. The width 60 of the unbonded region 69 was 0.57 mm. A Nikon Nomarski Optical Microscope image of a SOI structure produced from a conventional donor wafer and a conventional handle (i.e., no cleaning step between rough polish and finish polish) is shown in FIG. 6. The width 60 of the unbonded region 69 was 2.28 mm.

When introducing elements of the present disclosure or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A process for producing a silicon on insulator structure, the structure comprising a handle wafer, a silicon layer, and a dielectric layer between the handle wafer and the silicon layer, the structure having a central axis, a front surface and a back surface that are generally perpendicular to the central axis, a circumferential edge joining the front and back surfaces and a radius extending from the central axis to the circumferential edge, the process comprising:

forming a dielectric layer on a front surface of at least one of a donor wafer and a handle wafer;

bonding the dielectric layer to at least one of the donor wafer and the handle wafer to form a bonded wafer, wherein at least one of the donor wafer and the handle wafer has a thickness roll-off amount (ROA) of less than about −600 nm, wherein the thickness ROA is defined by the following measurement protocol that is based on a thickness profile of the donor wafer or handle wafer:

forming a reference line between a first discreet point and a second discreet point on the thickness profile, the first discreet point and second discreet point each being a distance from the central axis of the structure, the distance between the first discreet point and the central axis of the structure being about 82.7% of the radius of the structure and the distance between the second discreet point and the central axis of the structure being about 93.3% of the radius of the structure;

measuring a distance between the reference line and a third discreet point on the wafer thickness profile, the distance between the third discreet point and the central axis of the structure being about 99.3% of the radius of the structure; and separating the bonded wafer along a separation plane within the donor wafer such that the silicon layer remains bonded to the dielectric layer to form the silicon on insulator structure.

2. The process as set forth in claim 1 wherein the dielectric layer is formed on the donor wafer and the dielectric layer is bonded to the handle wafer, the handle wafer having a thickness ROA of less than about −600 nm.

3. The process as set forth in claim 2 wherein the donor wafer has a thickness ROA of less than about −600 nm.

4. The process as set forth in claim 1 wherein the dielectric layer is formed on the donor wafer and the dielectric layer is bonded to the handle wafer, the donor wafer having a thickness ROA of less than about −600 nm.

5. The process as set forth in claim 1 wherein the dielectric layer is formed on the handle wafer and the dielectric layer is bonded to the donor wafer, the donor wafer having a thickness ROA of less than about −600 nm.

6. The process as set forth in claim 5 wherein the handle wafer has a thickness ROA of less than about −600 nm.

7. The process as set forth in claim 1 wherein the dielectric layer is formed on the handle wafer and the dielectric layer is bonded to the donor wafer, the handle wafer having a thickness ROA of less than about −600 nm.

8. The process as set forth in claim 1 wherein the handle wafer and/or donor wafer has a thickness ROA of less than about −400 nm.

9. The process as set forth in claim 1 wherein the reference line is fitted as a first order linear line.

10. The process as set forth in claim 1 wherein the reference line is fitted as a third order polynomial.

11. The process as set forth in claim 1 wherein the thickness ROA is an average thickness ROA.

12. The process as set forth in claim 11 wherein the average thickness ROA is an average of eight thickness ROA measurements taken at eight wafer radii.

13. The process as set forth in claim 1 wherein at least one of the donor wafer and the handle wafer has a front surface zdd of less than about −1100 nm/mm$^2$.

14. The process as set forth in claim 1 wherein at least one of the donor wafer and the handle wafer has about 3 or less brightfield defects of a size greater than about 6 nm at its front surface.

15. The process as set forth in claim 1 wherein at least one of the donor wafer and the handle wafer is substantially free of brightfield defects of a size greater than about 6 nm at its front surface.

16. The process as set forth in claim 1 wherein at least one of the donor wafer and the handle wafer has less than about 6 brightfield defects of a size greater than about 4.8 nm at its front surface.

17. The process as set forth in claim 1 wherein at least one of the donor wafer and the handle wafer is free of brightfield defects of a size greater than about 4.8 nm at its front surface.

18. The process as set forth in claim 1 wherein the silicon layer extends from the central axis of the structure to a point about 98.9% of the radius of the structure.

19. The process as set forth in claim 1 wherein the silicon layer extends from the central axis of the structure to a point about 99.4% of the radius of the structure.

20. The process as set forth in claim 1 wherein at least one of the donor wafer and the handle wafer has a front surface and a back surface and is prepared by:
   performing a first polishing step that comprises polishing the front surface of the wafer;
   performing a cleaning step after the first polishing step, the cleaning step comprising cleaning the front surface of the wafer; and
   performing a second polishing step after the cleaning step, the second polishing step comprising polishing the front surface of the wafer.

21. The process as set forth in claim 20 wherein the back surface of the wafer is polished simultaneously as the front surface is polished during the first polishing step.

22. The process as set forth in claim 20 wherein the front surface of the wafer has a surface roughness, the first polishing step reducing the surface roughness of the front surface of the wafer to less than about 3 Å as measured by AFM scan sizes of about 1 μm×about 1 μm to about 100 μm×about 100 μm.

23. The process as set forth in claim 20 wherein the front surface of the wafer has a surface roughness, the second polishing step reducing the surface roughness of the front surface of the wafer to less than about 2.0 Å as measured by AFM scan sizes of about 10 μm×about 10 μm to about 100 μm×about 100 μm.

24. The process as set forth in claim 20 wherein the first polishing step comprises polishing the wafer with a polyurethane foam pad.

25. The process as set forth in claim 20 wherein the first polishing step comprises contacting a colloidal silica slurry with the wafer.

26. The process as set forth in claim 20 wherein the second polishing step comprise polishing the wafer with a polyurethane foam pad.

27. The process as set forth in claim 20 wherein the second polishing step comprises contacting a colloidal silica slurry with the wafer.

28. The process as set forth in claim 20 wherein the cleaning step comprises rinsing the wafer.

29. The process as set forth in claim 20 wherein the cleaning step comprises contacting the wafer with an ammonium hydroxide and hydrogen peroxide solution.

* * * * *